(12) United States Patent
Song

(10) Patent No.: US 12,308,810 B2
(45) Date of Patent: May 20, 2025

(54) EFFICIENT SUBBAND CHANNELIZER FOR RANDOMLY-SPACED FREQUENCY GROUPS

(71) Applicant: Massachusetts Institute of Technology, Cambridge, MA (US)

(72) Inventor: William S. Song, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 170 days.

(21) Appl. No.: 18/044,285

(22) PCT Filed: Jul. 12, 2021

(86) PCT No.: PCT/US2021/041240
§ 371 (c)(1),
(2) Date: Mar. 7, 2023

(87) PCT Pub. No.: WO2022/055611
PCT Pub. Date: Mar. 17, 2022

(65) Prior Publication Data
US 2023/0336161 A1    Oct. 19, 2023

Related U.S. Application Data

(60) Provisional application No. 63/077,751, filed on Sep. 14, 2020.

(51) Int. Cl.
*H03H 17/02*    (2006.01)
(52) U.S. Cl.
CPC ............... *H03H 17/0273* (2013.01)

(58) Field of Classification Search
CPC .................................... H03H 17/0273
USPC ........................................... 375/260
See application file for complete search history.

(56) References Cited

U.S. PATENT DOCUMENTS

| | | | |
|---|---|---|---|
| 7,142,607 B2 | 11/2006 | Song | |
| 10,230,407 B2 | 3/2019 | Zhang | |
| 2002/0004375 A1* | 1/2002 | Spencer | H04B 7/0811 455/280 |
| 2004/0141548 A1* | 7/2004 | Shattil | H04L 27/2614 375/146 |
| 2018/0019831 A1* | 1/2018 | Zhang | H04B 1/001 |

OTHER PUBLICATIONS

PCT International Preliminary Report on Patentability dated Mar. 23, 2023 for International Patent Application No. PCT/US2021/041240; 7 pages.

(Continued)

*Primary Examiner* — Leila Malek
(74) *Attorney, Agent, or Firm* — DALY, CROWLEY, MOFFORD & DURKEE, LLP

(57) ABSTRACT

A subband channelizer for randomly spaced frequency groups includes: a first-stage channelizer configured to channelize a wideband input into a plurality of intermediate subbands, at least two of the plurality of intermediate subbands being partially overlapped; and a plurality of second-stage channelizers each configured to generate one or more final subbands from one of the plurality of intermediate subbands, wherein the intermediate subbands have wider bandwidth than the final subbands.

20 Claims, 9 Drawing Sheets

(56) References Cited

OTHER PUBLICATIONS

PCT International Search Report and Written Opinion dated Oct. 11, 2021 for International Application No. PCT/US2021/041240; 13 pages.

Mengda Lin et al., "Very Low Complexity Variable Resolution Filter Banks for Spectrum Sensing in Cognitive Radios Using Multi-Stage Coefficient Decimation"; Wireless Communications, Networking and Mobile Computing, 2009. Sep. 24, 2009; 4 pages.

D. R. Zahirniak, D. L. Sharpin, T. W. Fields, "A Hardware-Efficient, Multirate, Digital Channelized Receiver Architecture," IEEE Transactions on Aerospace and Electronic Systems vol. 34, No. 1, Jan. 1998; 16 pages.

* cited by examiner

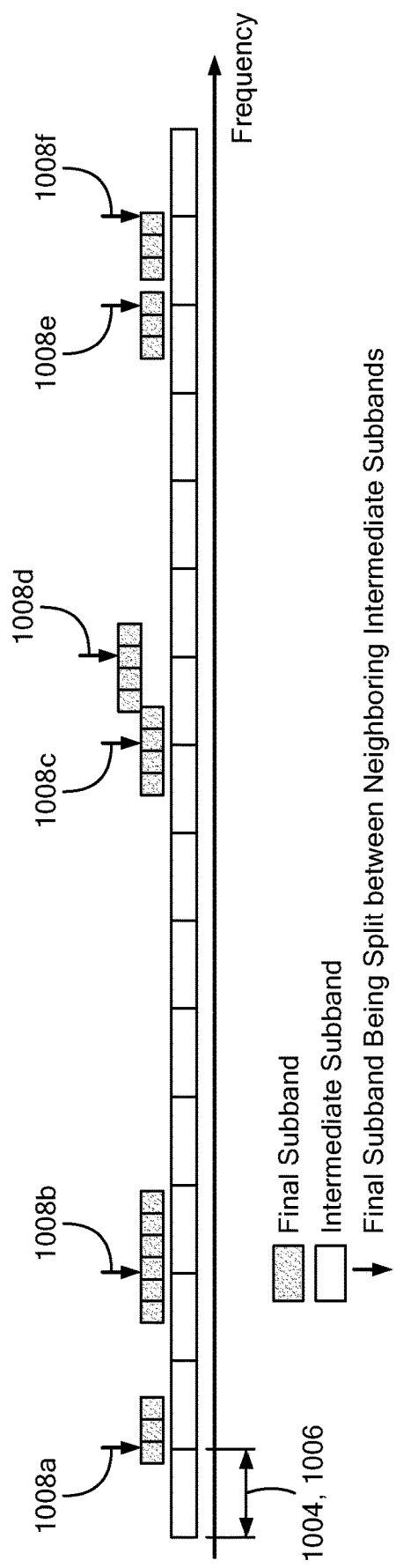
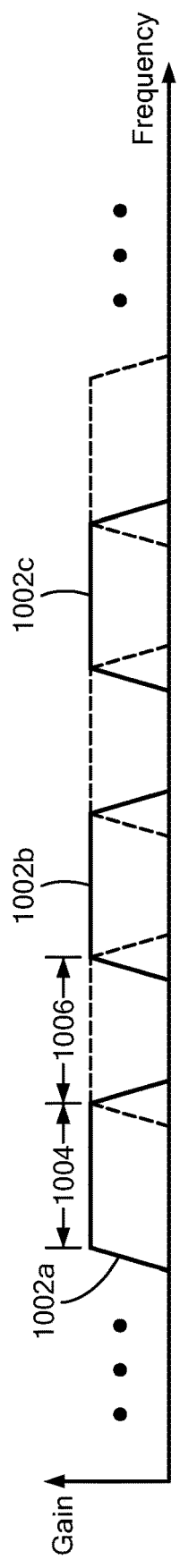

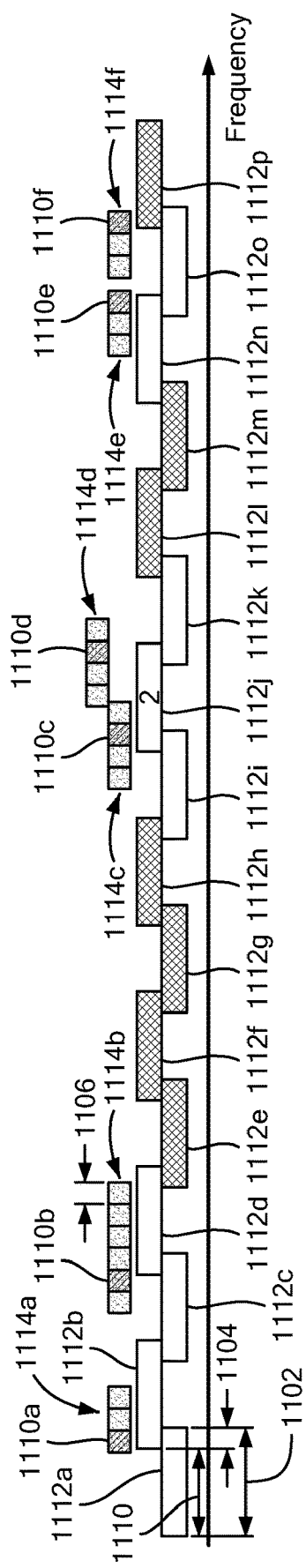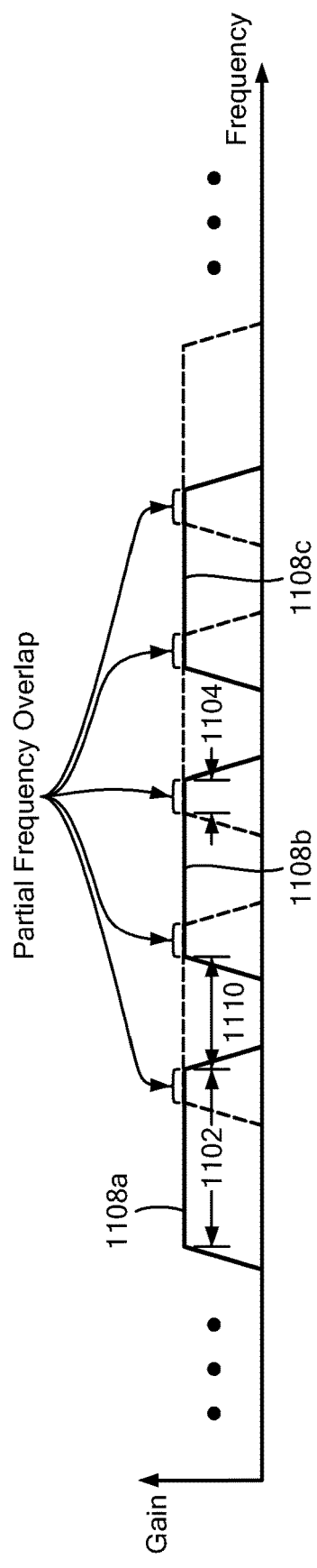
FIG. 11A
FIG. 11B

EFFICIENT SUBBAND CHANNELIZER FOR RANDOMLY-SPACED FREQUENCY GROUPS

CROSS REFERENCE TO RELATED APPLICATIONS

This application is a National Stage Entry of International Application No. PCT/US2021/041240, which was filed on Jul. 12, 2021, which claims the benefit of U.S. Provisional Application No. 63/077,751, which was filed on Sep. 14, 2020. The entire contents of these applications are incorporated herein by reference.

STATEMENT REGARDING FEDERALLY SPONSORED RESEARCH

This invention was made with government support under FA8702-15-D-0001 awarded by the U.S. Air Force. The government has certain rights in the invention.

BACKGROUND

RF communications and sensing systems can operate over a wide range of frequencies. The allocated bandwidth can contain multiple independent predefined smaller frequency channels—e.g., frequency division multiple access (FDMA)—or can be decomposed into smaller frequency bands. For communications and other applications involving many frequency channels, it is often convenient to sample wide bandwidth signals that contain many frequency channels with a high-speed analog-to-digital converter (ADC) and to digitally frequency channelize the data into multiple subbands or frequency channels. The subband is said to be critically sampled if the subband bandwidth is equal to the sampling rate of the subband. If the subband bandwidth is less than the sampling rate of the subband, then the subband is said to be oversampled.

For some applications, all subbands have the same bandwidth and sampling rate, and are spaced uniformly in frequency. However, for many other applications, subbands are organized into multiple groups because of frequency allocations, and different groups can have different numbers of subbands. Typically, subbands have the same bandwidth and identical frequency spacing within groups, but frequency groups are normally separated by different frequency separations that are not integer multiples of frequency spacing within the groups (e.g., due to real-world frequency allocations).

SUMMARY

It is appreciated herein that conventional digital subband channelizers may be designed to channelize subbands that have identical bandwidth and frequency spacing and, as such, they may not efficiently channelize subbands that are organized in groups with different numbers of subbands in each group and random frequency spacing between groups. Described herein are embodiments of a computationally efficient digital channelizer and related techniques that can efficiently channelize subbands that are organized in different size groups with random frequency spacing between the groups, yet the subbands within a particular group may have the same bandwidth and frequency spacing.

According to one aspect of the present disclosure, a subband channelizer for randomly spaced frequency groups may include: a first-stage channelizer configured to channelize a wideband input into a plurality of intermediate subbands, at least two of the plurality of intermediate subbands being partially overlapped; and a plurality of second-stage channelizers each configured to generate one or more final subbands from one of the plurality of intermediate subbands, wherein the intermediate subbands have wider bandwidth than the final subbands.

In some embodiments, the first-stage channelizer can include a first-stage polyphaser channelizer to channelize the wideband input into the plurality of intermediate subbands using a Fourier transform. In some embodiments, the first-stage channelizer further may have a first-stage digital down-converter (DDC) to shift the frequency of the wideband input, wherein the first-stage polyphaser channelizer channelizes the frequency-shifted wideband input. In some embodiments, one of more of the second-stage channelizers can include: a second-stage digital down-converter (DDC) to frequency shift the intermediate subband; and a second-stage polyphaser channelizer configured to generate the one or more final subbands based on the frequency-shifted intermediate subband. In some embodiments, the second-stage DDC may be configured to shift the frequency of the intermediate subband to align a center frequency of one of the final subbands with a center frequency of the second-stage polyphaser channelizer. In some embodiments, a subband frequency spacing within one or more of the frequency groups may be the same.

In some embodiments, frequency gaps between frequency groups are not integer multiples of frequency spacing within the frequency groups. In some embodiments, different second-stage channelizers to have different subband frequency spacing. In some embodiments, different second-stage channelizers have different decimation rates. In some embodiments, the second-stage polyphaser channelizers use a Fast Fourier transform (FFT) or a Discrete Fourier Transform (DFT) to generate the final subbands. In some embodiments, different second-stage channelizers to have different Fourier Transform sizes.

According to one aspect of the present disclosure, a subband channelizer for randomly spaced frequency groups may include: a first-stage channelizer configured to channelize a wideband input into a plurality of intermediate subbands, at least two of the plurality of intermediate subbands being partially overlapped; and a plurality of second-stage channelizers. Each of the second-stage channelizers can be configured to generate one or more final subbands from one of the plurality of intermediate subbands and may include: a second-stage digital down-converter (DDC) to frequency shift the intermediate subband, and a second-stage polyphaser channelizer configured to generate the one or more final subbands based on the frequency-shifted intermediate subband.

In some embodiments, frequency the first-stage channelizer can further include: a first-stage digital down-converter (DDC) to shift the frequency of the wideband input, wherein the first-stage polyphaser channelizer channelizes the frequency-shifted wideband input. In some embodiments, at least one of the second-stage DDCs may be configured to shift the frequency of the intermediate subband to align a center frequency of one of the final subbands with a center frequency of the second-stage polyphaser channelizer. In some embodiments, a subband frequency spacing within one or more of the frequency groups may be the same. In some embodiments, frequency gaps between frequency groups may not be integer multiples of frequency spacing within the frequency groups. In some embodiments, different second-stage channelizers can have different subband frequency spacing. In some embodiments, different second-stage channelizers may have different decimation rates.

According to one aspect of the present disclosure, a subband channelizer can include a means for efficiently channelizing a plurality of frequency subbands that are organized in different size groups with random frequency spacing between the groups, wherein all frequency subbands within a group have the same bandwidth and frequency spacing.

BRIEF DESCRIPTION OF THE DRAWINGS

The manner of making and using the disclosed subject matter may be appreciated by reference to the detailed description in connection with the drawings, in which like reference numerals identify like elements.

FIG. 10A illustrates two-stage channelization for randomly spaced frequency groups using conventional first- and second-stage channelizers.

FIG. 10B shows polyphase filter shapes for non-overlapping intermediate subbands of a conventional channelizer.

FIG. 11A shows two-stage channelization for randomly spaced frequency groups using a two-stage channelizer with overlapped intermediate subbands, according to embodiments of the present disclosure.

FIG. 11B shows polyphase filter shapes for overlapping intermediate subbands in the first-stage channelizer, according to embodiments of the present disclosure.

The drawings are not necessarily to scale, or inclusive of all elements of a system, emphasis instead generally being placed upon illustrating the concepts, structures, and techniques sought to be protected herein.

DETAILED DESCRIPTION

Figure 1:
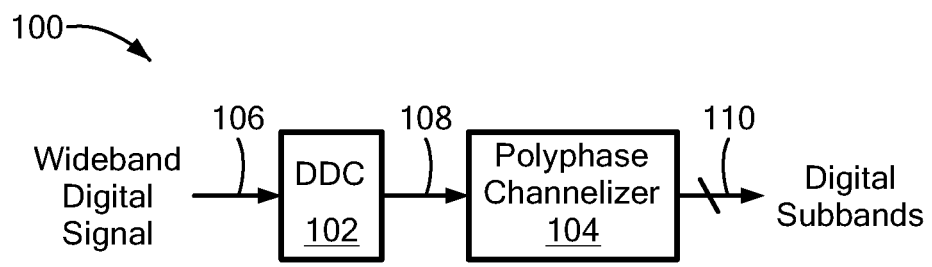
FIG. 1 shows an example of a conventional digital subband channelizer.

Referring to FIG. 1, digital subband channelization with uniform subband frequency spacing is conventionally done in two steps. A digital subband channelizer 100 can include a digital down-converter (DDC) 102 and a polyphase channelizer 104. A wideband digital input signal 106 is first down-converted to baseband by a digital down-converter (DDC). The DDC frequency shifts the subbands so that the center frequency of one of the subbands, usually the one near the middle of the frequency range of interest, lines up with DC. The output 108 of DDC 102 is then provided as input to polyphase channelizer 104 which in turn produces subbands 110 as output. Examples of structures and techniques that can be implemented within DDC 102 are described below in the context of FIGS. 2 and 3. Examples of structures and techniques that can be implemented within polyphase channelizer 104 are described below in the context of FIGS. 4 and 5.

Figure 2:
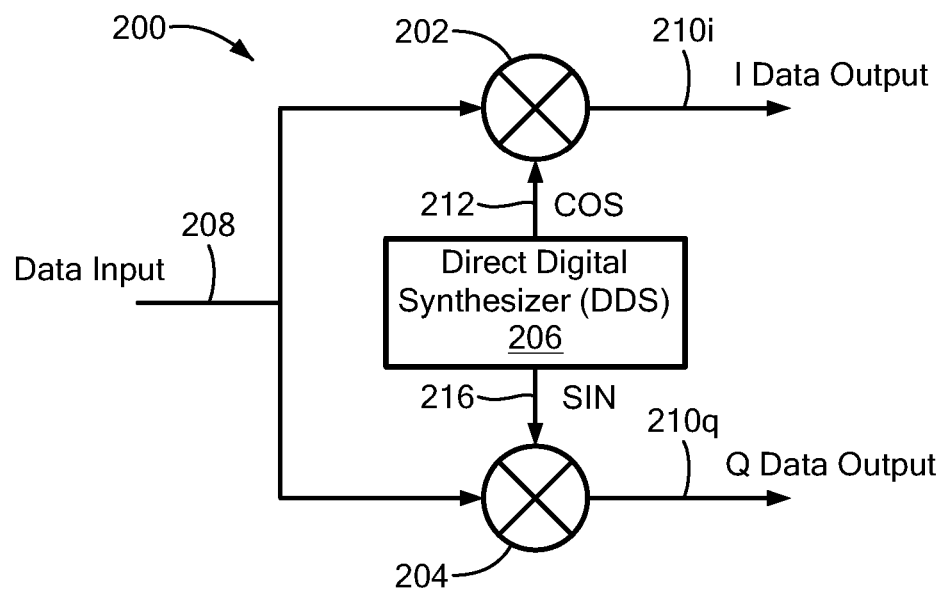
FIG. 2 shows an example of a digital down-converter (DDC) with real input that can be provided within the digital subband channelizer of FIG. 1.

FIG. 2 shows an example of a DDC 200 that can be used within a digital subband channelization where the wideband digital input signal has only the real component (or in-phase component) such as the output of a wideband ADC. The illustrative DDC 200 includes a first multiplier 202, a second multiplier 204, and a direct digital synthesizer (DDS) 206. An in-phase (I) output signal $210i$ can be generated by multiplying, using first multiplier 202, a wideband digital input signal 208 by a first digital sinusoidal signal 212 generated by DDS 206. A quadrature (Q) output signal $210q$ can be generated by multiplying, using second multiplier 204, the wideband digital input signal 208 by a second digital sinusoidal signal 216 generated by DDS 206, where the first and second digital sinusoidal signals 212, 216 are ninety (90) degrees apart in phase.

Figure 3:
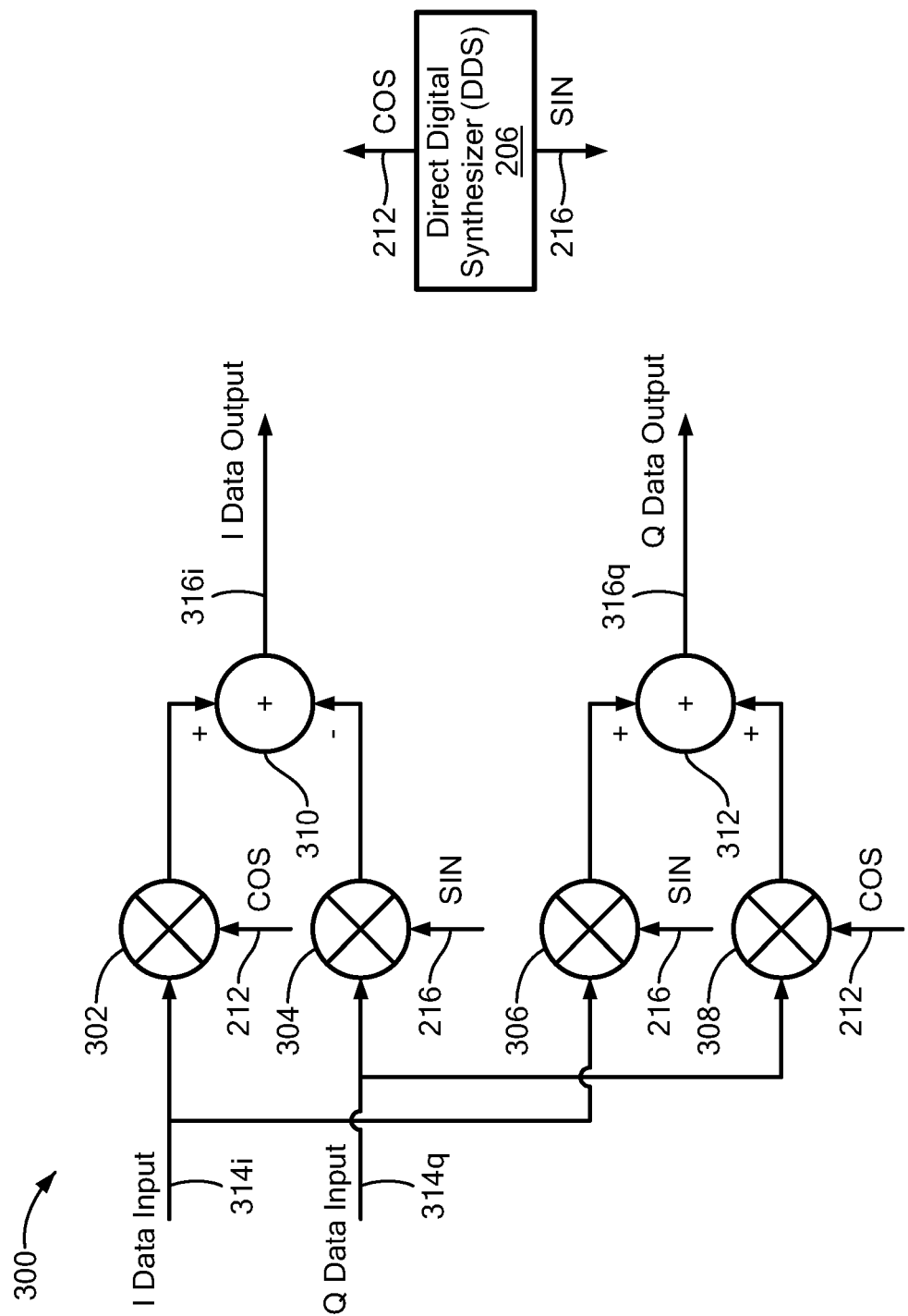
FIG. 3 shows an example of a DDC with complex input that can be used provided the digital subband channelizer of FIG. 1

FIG. 3 shows an example of a DDC 300 that can be used within a digital subband channelization where the wideband digital input signal is complex and has both I and Q components. The illustrative DDC 200 includes a first multiplier 302, a second multiplier 304, a third multiplier 306, a fourth multiplier 308, a first adder 310, a second adder 312, and DDS 206. The I component $314i$ of the input signal is multiplied by the first and second digital sinusoidal signals 212, 216 using first and third multipliers 302, 306, respectively. The Q component $314q$ of the input signal is multiplied by the first and second digital sinusoidal signals 212, 216 using fourth and second multipliers 308, 304, respectively. The output of the first and second multipliers 302, 304 are summed using first adder 310 to produce an in-phase (I) output signal $316i$ and the output of the third and fourth multipliers 306, 308 are summed using second adder 312 to produce a quadrature (Q) output signal $316q$.

Figure 4:
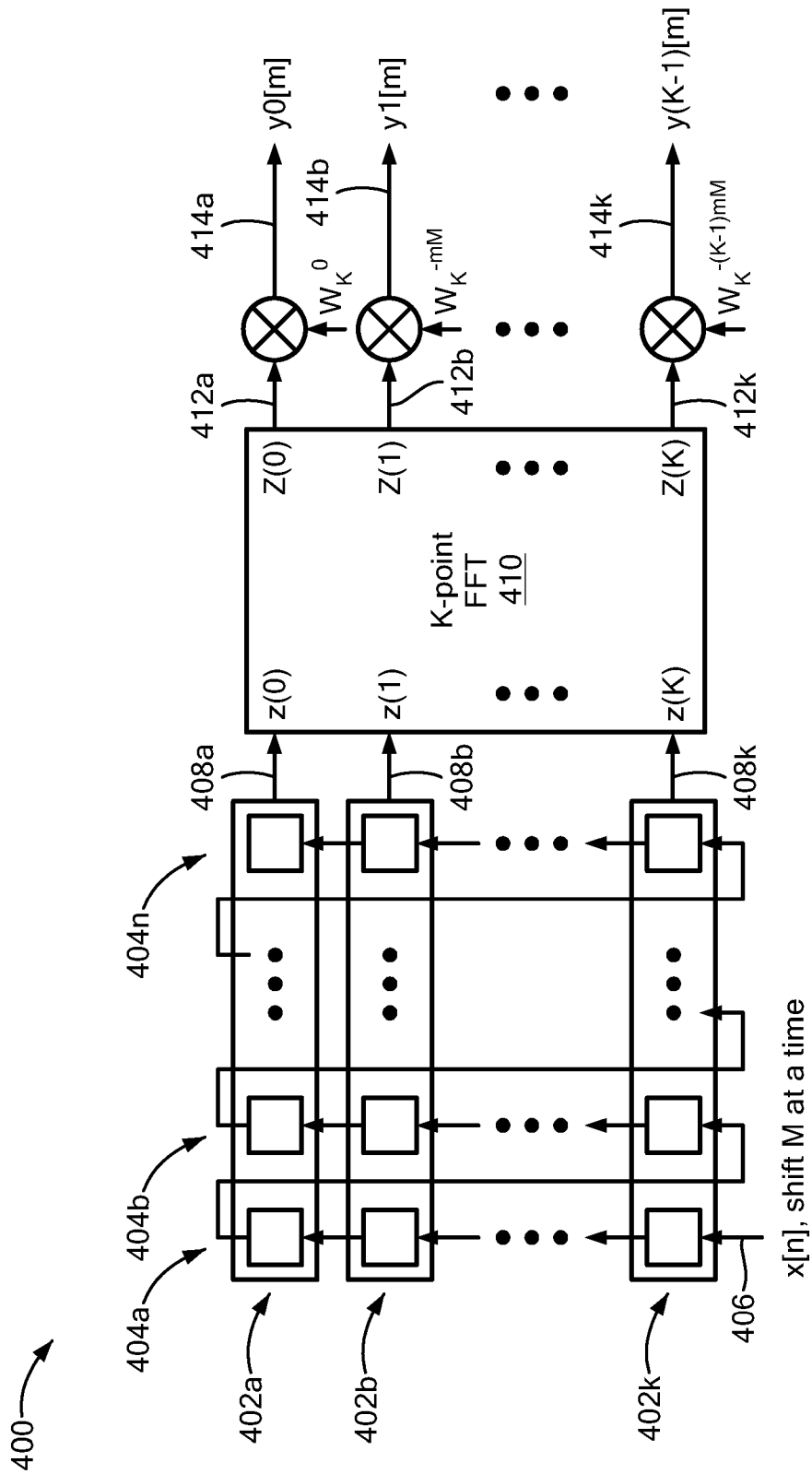
FIG. 4 shows an example of a polyphase channelizer that can be provided within the digital subband channelizer of FIG. 1.

Turning to FIG. 4, a polyphase channelizer with uniformly spaced frequency subbands can be implemented using a short-time Fourier transform. FIG. 4 shows a computational hardware implementation of a polyphase channelizer 400 using a short-time Fourier transform. Each row represents a polyphase filter 402a, 402b, ..., 402k (402 generally) and there are K filters all together. Each polyphase filter 402 has N taps 404a, 404b, ..., 404n (404 generally), which are individually represented as boxes and arranged in columns in FIG. 4. Each of the N taps 404 may be associated with a different coefficient. The polyphase filter coefficients may be selected (e.g., calculated) to provide desired filter characteristics such as passband ripple, stopband attenuation, and transition band width. Techniques that may be used for calculating polyphase filter coefficients include those described in (1) L. R. Rabiner and R. E. Crochiere, "Multirate Digital Signal Processing," Prentice-Hall, 1983; and (2) D. R. Zahirniak, D. L. Sharpin, T. W. Fields, "A Hardware-Efficient, Multirate, Digital Channelized Receiver Architecture," IEEE Transactions on Aerospace and Electronic Systems Vol. 34, No. 1, January 1998, which are herein incorporated by reference in their entireties.

Input data 406 are shifted M samples at a time through the K polyphase filters 402 in a "snake-like" fashion as shown. Thus, the output from each tap is connected to the input of the tap, which is M taps away in the "snake-like" path. In each of the K polyphase filters 402a, 402b, ..., 402k, the input data 406 are multiplied with coefficients and summed to produce corresponding output data 408a, 408b, ..., 408k (408 generally). This is shown more clearly in FIG. 5, discussed below. Transposed or retimed versions of the polyphase filters 402 can also be used, as long as they are mathematically equivalent.

The filter outputs 408 are provided as inputs to Fourier transform 410 to produce K Fourier transformed outputs 412a, 412b, ..., 412k (412 generally). Fourier transform 410 can be implemented, for example, as a Fast Fourier transform (FFT) or a Discrete Fourier Transform (DFT). The Fourier transformed outputs 412a, 412b, ..., 412k are then multiple with corresponding exponentials to produce subband outputs 414a, 414b, ..., 414k (414 respectively), respectively. The kth exponential $W_k$ is equal to $W_k = e^{(j2\pi k/K) + \phi}$, where k=0, 1, ..., K–1 and $\phi$ is a phase offset (set to 0 or $\pi$/K in most cases). To improve efficiency, the polyphase filters 402 can be grouped together such that the input data 406 communication paths are minimized. The oversampling ratio for the subband outputs 414 is equal to K/M. The oversampling ratio for the critically sampled case is equal to one (1) where K=M.

Figure 5:
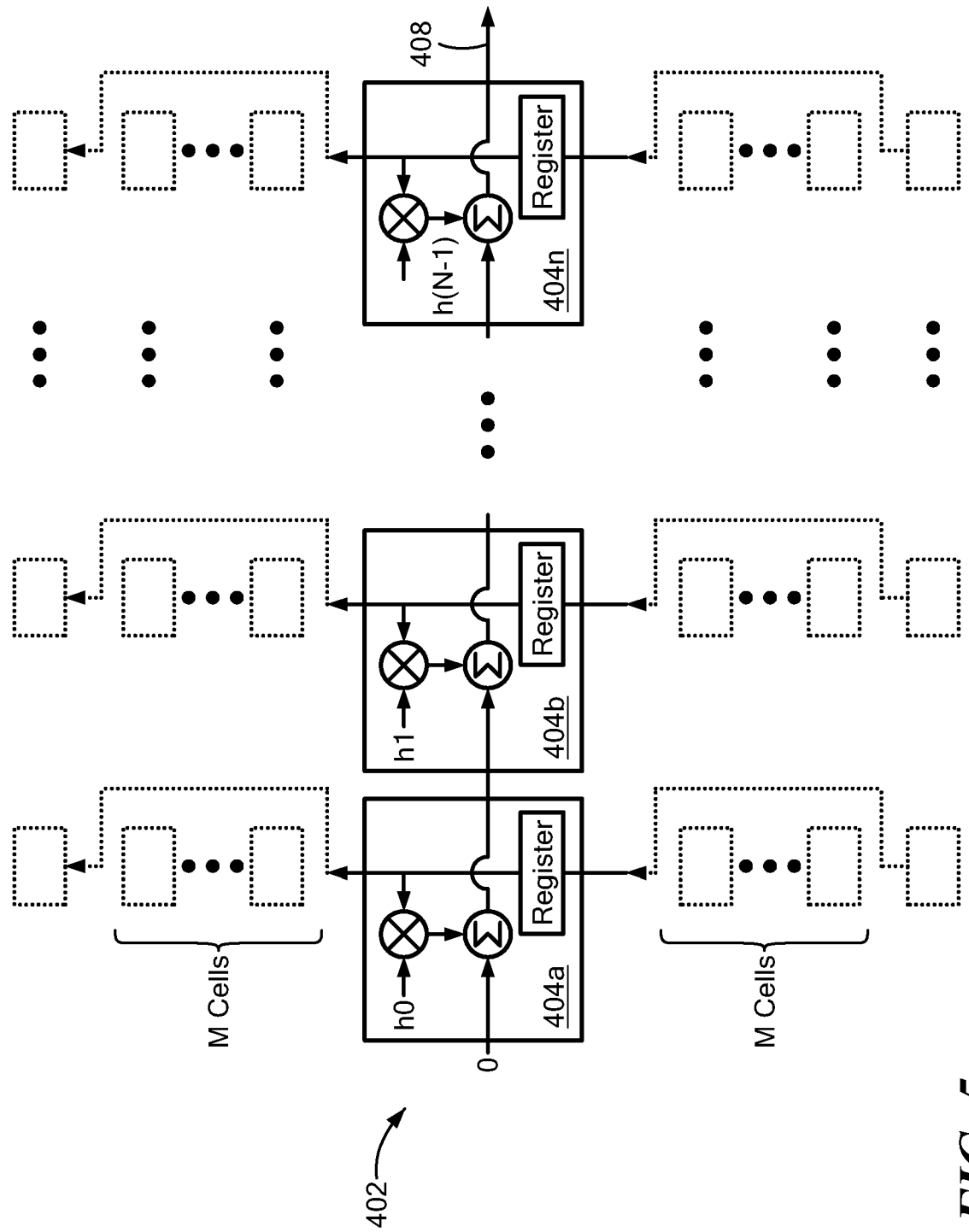
FIG. 5 shows an example of a polyphase filter that can be provided within the polyphase channelizer of FIG. 4.

FIG. 5 shows an illustrative architecture for a single polyphase filter of FIG. 4. As shown, a single polyphase filter 402 has N taps with N coefficients h0, h1, ... h(N–1). Overall, a polyphase channelizer can have K×N taps each with its own coefficients. The output from each tap 404a, 404b, ..., 404n is connected to the input of the tap, which is M taps away in the "snake-like" path. Within a particular polyphase filter 402, the input data are multiplied with coefficients and summed to produce the corresponding output data 408, as shown.

Figure 6:
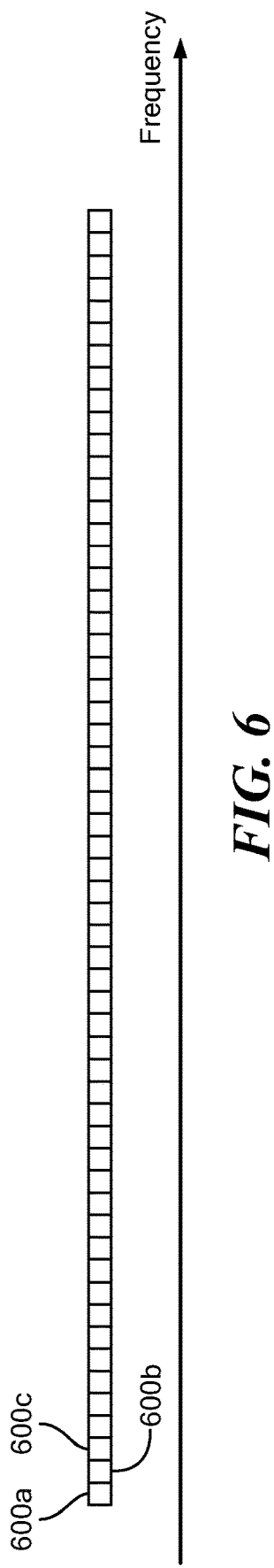
FIG. 6 shows an example of a uniformly spaced frequency subband.
Figure 7:
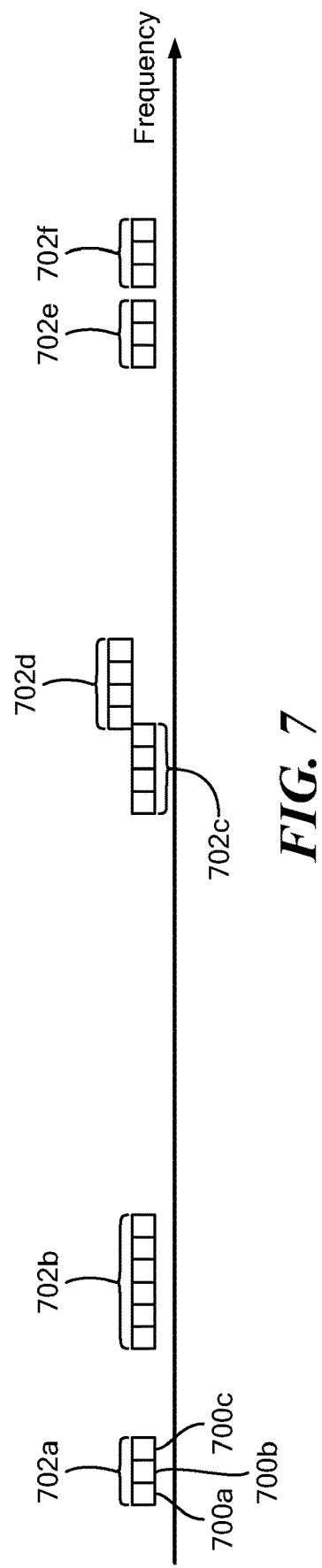
FIG. 7 shows an example of randomly spaced frequency groups.

Turning to FIGS. 6 and 7, it is appreciated herein that, although conventional digital subband channelizers (e.g., channelizer 100 of FIG. 1) may be well suited for generating channelized subbands that are uniformly spaced in the frequency domain, they are generally not suitable (e.g., in terms of efficiency) when the frequency spacing is irregular. In real-world applications, due to frequency allocation issues, a large number of subband frequencies are seldom allocated in one continuous frequency segment (or "group"). Rather, there may be several separate frequency groups for a single application.

FIG. 6 shows an example of uniformly spaced subbands 600a, 600b, 600c, etc. and FIG. 7 shows an example of randomly spaced frequency groups 702a-702f (702 generally). In the latter cases, although the frequency spacing between subbands within a particular frequency group (e.g., subbands 700a, 700b, and 700c within group 702a) is identical or substantially identical, frequency gaps between frequency groups 702 may not be integer multiples of frequency spacing within the groups. The randomly spaced frequency group example shown in FIG. 7 may correspond to a real-world application with six frequency groups 702a-702f. In this example, the gaps between frequency groups are not only random and vary in size, one gap (i.e., between groups 702c and 702d) is also negative, illustrating how there can be overlap between neighboring subbands from two different frequency groups 702 in real-word applications.

Figure 8:
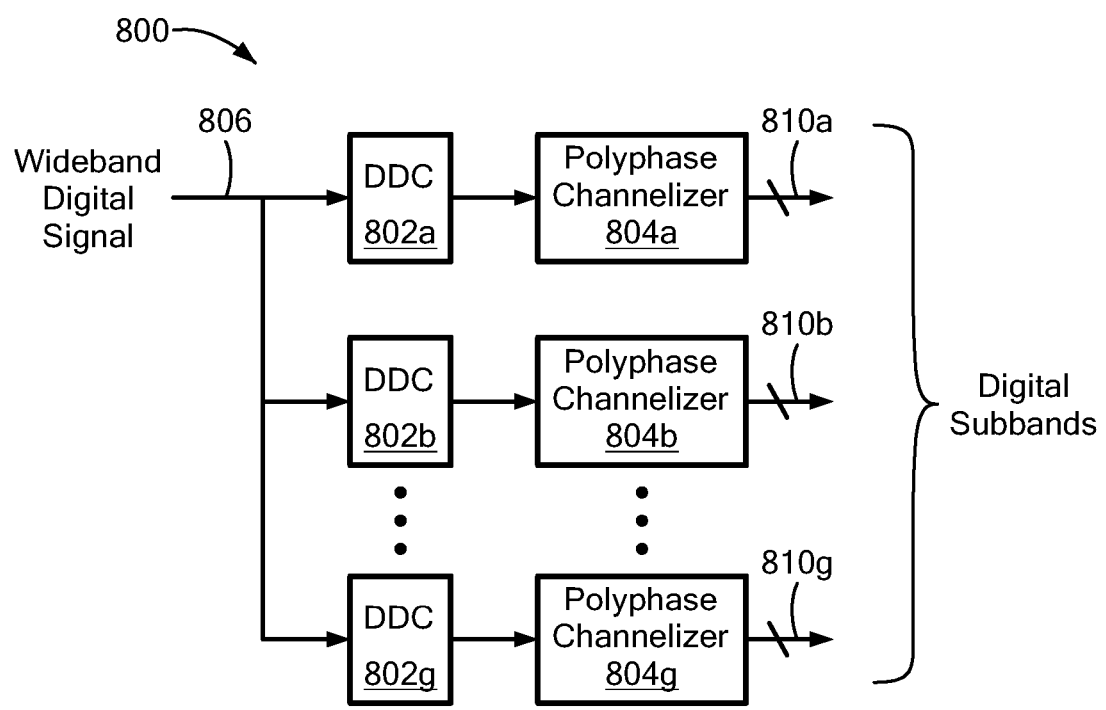
FIG. 8 shows an example of a digital subband channelizer for randomly spaced frequency groups based on the conventional digital subband channelizer of FIG. 1.

Turning to FIG. 8, conventional digital subband channelizers with uniform subband spacing (e.g., digital subband channelizer 100 of FIG. 1) are generally not suitable for channelizing randomly spaced frequency groups found in real-word applications. FIG. 8 shows one possible implementation for such applications based on conventional subband channelizers. Here, G separate DDC and polyphase channelizer pairs may be used for each of G frequency groups.

An illustrative digital subband channelizer 800 can include G DDCs 802a, 802b, ..., 802g (802 generally) each arranged in parallel with a corresponding one of G polyphase channelizers 804a, 804b, ..., 804g (804 generally). A particular DDC 802 and polyphase channelizer pair (e.g., DDC 802a and polyphase channelizer 804a) may be configured to channelize the subbands in a particular frequency group. A particular DDC 802 may be the same as or similar to DDC 200 of FIG. 2 or DDC 300 of FIG. 3. A particular polyphase channelizer 804 may be the same as or similar to polyphase channelizer 400 of FIG. 4.

A wideband digital input signal 806 may be provided as input to each of the DDCs 802 and, in turn, each of the polyphase channelizers 804 may produce, as output, one or more subbands in the corresponding group. For example, a first polyphase channelizer 804a can output first subbands 810a within a first group, a second polyphase channelizer 804b can output first subbands 810b within a second group, etc. DDCs 802 may be configured to shift the frequency of wideband digital input signal 806 so that the frequency centers of the input subbands in each group can be aligned with the frequency centers of the polyphaser filter subbands of a separate polyphaser channelizer 804. For example, a first DDC 802a may be configured to shift the frequency of wideband digital input signal 806 to align with a first frequency group and a second DDC 802b may be configured to shift the frequency of wideband digital input signal 806 to align with a second frequency group.

One drawback of the digital subband channelizer implementation shown in FIG. 8 is that the computational throughput (e.g., usage) is G times higher than in the uniformly spaced subband case, where G is the number of randomly spaced frequency groups. This can result in increased power consumption among other inefficiencies.

Figure 9:
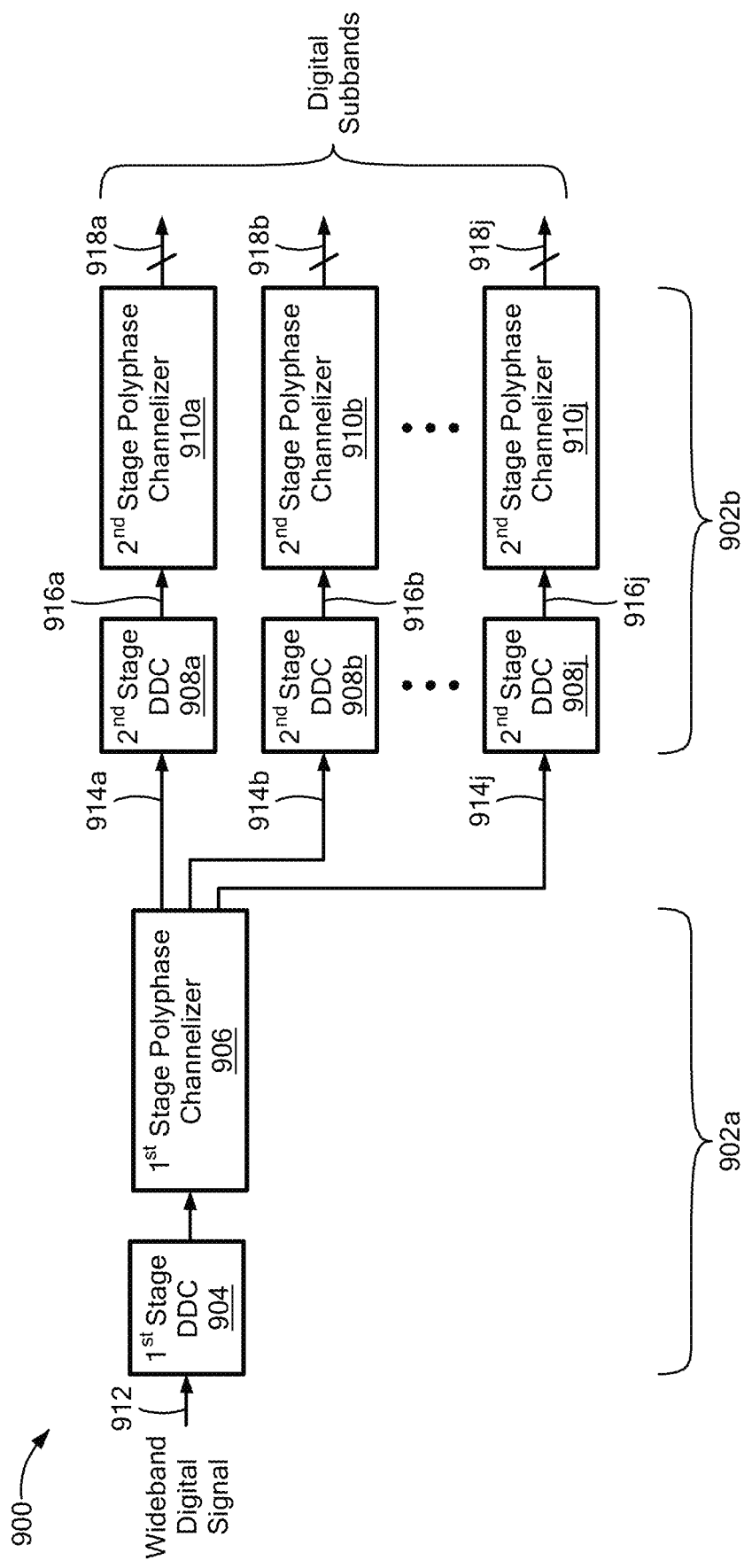
FIG. 9 shows an efficient digital subband channelizer for randomly spaced frequency groups, according to embodiments of the present disclosure.

FIG. 9 shows a computationally efficient digital subband channelizer 900 for randomly spaced frequency groups, according to embodiments of the present disclosure. The digital subband channelizer 900 may be used, for example, in applications where the subband frequency spacing within frequency groups is identical or substantially identically, but where frequency gaps between frequency groups are not integer multiples of frequency spacing within the frequency groups.

Illustrative digital subband channelizer 900 includes a first stage 902a and a second stage 902b. The first stage 902a includes a first-stage DDC 904 and a first-stage polyphase channelizer 906. The second stage 902b includes J second-stage DDCs 908a, 908b, ..., 908j (908 generally) each arranged in parallel with a corresponding one of J second-stage polyphase channelizers 910a, 910b, ..., 910j (910 generally). First stage 902a may be configured to channelize a wideband digital input signal 912 into J intermediate subbands 914a, 914b, ..., 914j (914 generally) which can have significantly wider bandwidth than final subbands 918a, 918b, ..., 918j (918 generally) output from channelizer 900.

The number of J may correspond to a number of intermediate subbands 914 that include, or overlap with, at least one subband of interest (or final subband). As discussed further below, first-stage polyphase channelizer 906 may produce more than J intermediate subbands, not all of which may include/overlap a subband of interest. These other intermediate subbands may be disregarded by the second stage 902b to improve the computational efficiency of digital subband channelizer 900. As used herein, the term "subband of interest" refers to a frequency band that is used by, or otherwise of interest to, a particular application for which the digital subband channelizer is being employed.

The various components of digital subband channelizer 900 (e.g., DDCs 904, 908 and polyphase channelizers 906, 910) may be implemented using application-specific integrated circuits (ASIC), the Field Programmable Gate Array (FPGA), and in various processors such as digital signal processors (DSPs) or general purpose computers (e.g., machines having central processing units, or CPUs). In some embodiments, digital subband channelizer 900 may be implemented such that the number, J, of second-stage DDCs 908 and of second-stage polyphase channelizers 910 can be adjusted according to the needs of a particular application (e.g., based on the subbands of interest for a particular application). For example, J may be a value that is hard-coded/pre-programmed into digital subband channelizer 900 or it may be a parameter that is stored within a programmable memory (e.g., an EEPROM). The programmable memory can be part of digital subband channelizer 900 or otherwise accessible by digital subband channelizer 900. Other parameters that may be programmed within digital subband channelizer 900 are discussed below. In some embodiments, digital subband channelizer 900 can include a single physical or logical implementation of a second-stage DDC 908 and/or a second-stage polyphase channelizer 910 and can channelize J intermediate subbands 914 one-by-one, in an iteratively manner, using the single second-stage DDC 908 or second-stage polyphase channelizer 910. In this case, the second-stage DDC 908 may be reconfigured at each iteration to frequency shift the intermediate subband 914.

A particular second-stage DDC 908 and second-stage polyphase channelizer 910 pair (e.g., DDC 908a and polyphase channelizer 910a) may be configured to channelize subbands for a particular intermediate subband 914. The first-stage DDC 904 and/or ones of the second-stage DDCs 908 may be the same as or similar to DDC 200 of FIG. 2 or DDC 300 of FIG. 3. The first-stage polyphase channelizer 906 and/or ones of the second-stage polyphase channelizers 910 may be the same as or similar to polyphase channelizer 400 of FIG. 4. However, as discussed further below, first-stage polyphase channelizer 906 may be configured to use larger passband filters compared to conventional polyphase channelizers in order to produce intermediate subbands 914 that partially overlap.

Second-stage DDCs 802 may be configured to shift the frequency of intermediate subbands 914 as discussed below. The frequency-shifted intermediate subbands 916a, 916b, . . . , 916j can be further channelized using second-stage polyphaser channelizers 910 configured to output respective final subbands 918a, 918b, . . . , 918j. In some embodiments, the first-stage DDC 904 may be omitted from channelizer 900 such that frequency shifting occurs only within second-stage DDCs 908.

Turning to FIGS. 10A and 10B, it is appreciated herein that if two stages of subband channelizers are of the conventional type are used, it may not be able to implement the random frequency gaps between the frequency groups. This is because it is likely that some of the subbands of interest would end up across two neighboring non-overlapping intermediate subbands. FIG. 10B shows the shapes (i.e., notional filter gains) of polyphase filters 1002a, 1002b, 1002c, etc. (1002 generally) for non-overlapping intermediate subbands of a conventional channelizer. In this example, the passband bandwidth 1004 of each intermediate subband filter 1102 is shown to be equal to the frequency spacing 1006 between neighboring filters (e.g., between filters 1002a and 1102b). In other examples, the passband bandwidth 1004 can be narrower than the frequency spacing 1106 between the filters. In the example of FIG. 10A, there are six final subbands 1008a-1008f that are split between two neighboring intermediate subbands. The final subbands are the output subbands of the second-stage channelizer that contain the frequency bands of interest. In this example, the second-stage channelizer would not be able to correctly output the final subbands that were divided, i.e., final subbands 1008a-1008f.

FIGS. 11A and 11B illustrate a technique that that can prevent final subbands from being split between two neighboring intermediate subbands in a two-stage digital subband channelizer, according to some embodiments. The technique can be implemented, for example, within digital subband channelizer 900 of FIG. 9. To prevent final subbands from being split between neighboring intermediate subbands, the passband bandwidth 1102 of the intermediate subbands may be enlarged so that neighboring intermediate passbands partially overlap by a bandwidth 1104 that is at least as wide as the passband bandwidth 1106 of the subbands of interest (or the final subbands).

FIG. 11B illustrates the shapes of polyphase filters 1108a, 1108b, 1108c, etc. (1108 generally) of first-stage channelizer filters with partially overlapping intermediate subbands. The illustrative polyphase filters 1108 can be implemented, for example, within first-stage polyphase channelizer 906 of FIG. 9. In contrast to a conventional channelizer filters, here the passband bandwidth 1102 of each intermediate subband filter 1108 may be larger than the frequency spacing 1110 of the filters, which results in overlap bandwidth 1104. The passband bandwidth 1102 and frequency spacing 1110 may be selected (e.g., as design/configuration parameters) such that the overlap bandwidth 1104 is greater than or equal to the passband bandwidth 1106 of the subbands of interest. In this way, a subband of interest centered at any arbitrary frequency is guaranteed to end up fully in at least one intermediate subband at the output of the first-stage channelizer without being divided into two neighboring intermediate subbands.

In the example of FIG. 11A, there are sixteen (16) intermediate subbands 1112a-1112p and twenty-three (23) final subbands arranged in six (6) frequency groups 1114a-1114f (to promote clarity, not all of the final subbands are labeled in the figure). Six final subbands 1110a-1110f span two neighboring intermediate subbands but, as a result of the disclosed overlapping subband technique, are fully contained in at least one intermediate subband. For example, final subband 1110e spans neighboring intermediate subbands 1112n and 1112o while being fully contained within intermediate subband 1112o.

The conventional channelizer of FIG. 8 includes multiple copies of the channelizer shown in FIG. 4. In FIG. 8, the polyphase channelizers 804 may each have desired parameters K (the number of polyphase filters) and M (the size of the sample shift per clock cycle, or decimation ratio) and each of the DDCs 802 may have as a parameter of desired frequency shift. In order to provide the equivalent function, the 2-stage channelizer of FIG. 9 may provide equivalent overall K, M, and DDC frequency shift. That means that the overall decimation ratio M which is equal to the product of the first-stage decimation ratio, herein denoted $M_1$, and the second-stage decimation ratio, herein denoted $M_2$. The final subband frequency spacing is adjusted by K in the channelizer of FIG. 8. The final subband frequency spacing for the 2-stage channelizer of FIG. 9 may be adjusted by varying $M_1$ and $K_2$, the number of polyphase filters in each second-stage polyphase channelizer 916. In addition, the frequency spacing within an intermediate subband 914 may be adjusted by varying $K_1$, the number of polyphase filters in first-stage polyphase channelizer 906. Thus, according to some embodiments, the parameters $M_1$, $M_2$, $K_1$, $K_2$ may be selected so as to find a suitable or ideally optimal solution in terms of channelization accuracy, reliability, and/or efficiency. In addition, the frequency shifts in the first-stage DDC 904 and ones of the second-stage DDCs 908 can be varied as well to find such a suitable or ideally optimal solution.

Referring to FIG. 9 and with continued reference to FIGS. 11A and 11B, to process intermediate subbands 914 that partially overlap, digital subband channelizer 900 may be configured such that the second-stage polyphase channelizers 910 channelize only the intermediate subbands 914 that contain the final subbands of interest. This can be done by first digitally shifting the frequencies of intermediate subbands 914 using second-stage DDCs 908 to align the final subband center frequencies (i.e., the center frequencies of individual final subbands) with the second-stage polyphase filter center frequencies (i.e., the center frequencies of individual second-stage polyphase filters). The center frequency of a second-stage polyphaser filter within a particular second-stage polyphase channelizer 910 is adjusted using the corresponding second-stage DDC 908. Changing the second-stage DDC 908 moves the center frequencies of the entire frequency group within an intermediate subband. The spacing between individual center frequencies depend on the parameter $K_2$ and the intermediate frequency sample rate. The frequency-shifted intermediate subbands 916 can then be further channelized using the second-stage polyphase channelizers 910. In the example shown in FIG. 11A, there are nine intermediate subbands 1112a, 1112b, 1112c, 1112d, 1112i, 1112j, 1112k, 1112n, and 1112o that include, over overlap with, subbands of interest. Thus, in this example, at least nine (9) second-stage polyphase channelizers 910 may be used (i.e., J=9). The remaining intermediate subbands 1112e, 1112f, 1112g, 1112h, 1112l, 1112m, and 1112p need not be further channelized in the second-stage and, thus, can be disregarded. First-stage DDC 904 may also be used to find the optimal two-stage channelizer solution as previously mentioned.

A particular intermediate subband 1112 can include, or overlap with, more than one frequency group. In the example of FIG. 11A, intermediate subband 1112j overlaps with both frequency group 1114c and frequency group 1114d. In this case, multiple second-stage DDCs and second-stage polyphase channelizers may be used (or "attached") to channelize the corresponding subband. If two second-stage DDCs/channelizers are used for a particular intermediate subband, then the second-stage DDC may be configured so that every final subband is centered around DC in at least one final subband output of two second-stage channelizers.

In general, wide intermediate subband bandwidth is more efficient for computation because the overlapping bandwidth is small compared to the non-overlapping bandwidth, assuming that the overlap is equal to the passband bandwidth of the final subbands. Larger overlapping bandwidth results in higher sample rates for each intermediate subband and requires more computation. However, larger intermediate subband bandwidth increases the probability that an intermediate subband would contain multiple frequency groups, which would require multiple second-stage channelizers needing to be attached to that intermediate subband, which in turn increases the computational throughput. The intermediate subband bandwidth (e.g., the optimal intermediate subband bandwidth) may likely be somewhat close to the average of the total bandwidths of the frequency groups in many real-world applications. Such is the case in the example shown in FIG. 11A.

For improved performance, the decimation rate and Fourier transform sizes (e.g., FFT sizes) in each stage can be carefully selected for first- and second-stage channelizers. The sample rate of the wideband input, final subband output, and the intermediate subband are referred to herein as $S_{in}$, $S_{out}$, and $S_{int}$, respectively. The FFT size of the first-stage channelizer (which is equal to the number of polyphase filter in the first-stage channelizer) is referred to as $K_1$, and the FFT size of the second-stage channelizer is referred to as $K_2$.

The decimation rate M between the wideband input and the final output subbands may be equal to the product of the first-stage channelizer decimation rate $M_1$ and the second-stage channelizer decimation rate $M_2$.

$$M = M_1 \times M_2 = (S_{in}/S_{int}) \times (S_{int}/S_{out})$$

The oversampling ratios of the intermediate subbands and the final subbands are equal to $K_1/M_1$ and $K_2/M_2$, respectively. All the decimation rates, including M, $M_1$, and $M_2$, may be positive integer numbers to make implementation practical. The first-stage channelizer FFT size $K_1$ can control the frequency spacing of the intermediate subbands. The intermediate subband frequency spacing may equal $S_{in}/K_1$. The second-stage channelizer FFT size $K_2$ can control the frequency spacing of the final subbands. The final subband frequency spacing may equal $S_{int}/K_2$.

In estimating computational throughput, only the multiplication will be counted for convenience. Although there are similar numbers of additions involved in computation, the computational hardware required for implementing additions is much less than the hardware for multiplication and can therefore be ignored for first-order approximation.

The approximate computational throughput in terms of the number of multiplications per second for the conventional one-stage channelizer and the new two-stage channelizer are shown in Table 1. J is equal to the number of intermediate subbands that contain the final subbands of interest. It can be assumed that four real multiplications are used to implement one complex multiplication operation.

In some embodiments, one or more of the following assumptions can be made:

$S_{in}/S_{int} \gg 1$ (i.e., the subband sample rate is much lower than wideband input sample rate);

$1 \le (K/M \approx K_1/M_1 \approx K_2/M_2) \le 2$, (i.e., the oversampling ratio for input, output, and intermediate subbands are similar and are between 1 and 2);

$1 \ll (N \approx N_1 \approx N_2)$, (i.e., all polyphase filters have a similar number of taps, which are much greater than 1); and $1 \ll (\log_2 K \approx \log_1 K_1 + \log_2 K_2)$, (i.e., K is reasonably large).

The computational throughput for the new two-stage channelizer with overlapping intermediate subbands is then approximately 1/G of the computational throughput of the conventional one-stage channelizer, as shown in the bottom row Table 1. For the example shown in FIG. 11A, for which G=6, this means approximately six times the savings in computation.

TABLE 1

| Function | Computational Throughput for Conventional One-Stage Channelizer | Computational Throughput for Disclosed Two-Stage Channelizer | |
|---|---|---|---|
| | | First Stage Channelizer | Second Stage Channelizer |
| DDC | $G \times 4 \times S_{in}$ | $4 \times S_{in}$ | $J \times 4 \times S_{int}$ |
| Polyphase Filter | $G \times 2 \times N \times (K/M) \times S_{in}$ | $2 \times N_1 \times (K_1/M_1) \times S_{in}$ | $J \times 2 \times N_2 \times (K_2/M_2) \times S_{int}$ |
| FFT (when K is power of 2) | $G \times 4 \times (K/M) \times \log_2 K \times S_{in}$ | $4 \times (K_1/M_1) \times \log_2 K_1 \times S_{in}$ | $J \times 4 \times (K_2/M_2) \times \log_2 K_2 \times S_{int}$ |
| Post-FFT Multiply | $G \times 4 \times (K/M) \times S_{in}$ | $4 \times (K_1/M_1) \times \log_2 K_1 \times S_{in}$ | $J \times 4 \times (K_2/M_2) \times S_{int}$ |
| Total | $G \times 4 \times (K/M) \times (N/2 + \log_2 K + [M/K] + 1) \times S_{in}$ | $4 \times (K_1/M_1) \times (N_1/2 + \log_2 K_1 + [M_1/K_1] + 1) \times S_{in}$ | $G \times 4 \times (K_2/M_2) \times (N_2/2 + \log_2 K_2 + [M_2/K_2] + 1) \times S_{int}$ |
| Ratio of Total | ≈G | ≈1 | <<1 |

Table 1 shows computational throughput required for conventional single-stage channelizer and new two-stage channelizer.

It is also possible for different second-stage channelizers to have different subband frequency spacing $S_{int}/K_2$, decimation ratio $M_2$, and different output sample rate $S_{out}$ by varying $K_2$ and $M_2$ between the second-stage channelizer. The frequency overlap between intermediate subbands may be equal to or greater than the largest passband bandwidth of the final output subbands. Such channelizers would be useful if different frequency groups are used for different communication standards, for example.

The new channelizer presented can be implemented in application-specific integrated circuits (ASIC), the Field Programmable Gate Array (FPGA), and in various processors such as digital signal processors (DSPs); graphics processing units (GPUs); and general purpose processors including microprocessors, microcontrollers, embedded processors, and media processors.

The proposed channelizer can be being implemented using FPGA and ASIC. Significant hardware reductions and power consumption reductions are expected compared to traditional approaches.

There are many applications for an efficient channelizer for randomly spaced frequency groups. Many communications applications use frequency allocation that has the frequency channels allocated in groups. Such communications may include cellular communications, satellite communications, long-distance radio communications, local network communications, military communications, etc.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A subband channelizer for randomly spaced frequency groups, the subband channelizer comprising:
    a first-stage channelizer configured to channelize a wideband input into a plurality of intermediate subbands, at least two of the plurality of intermediate subbands being partially overlapped; and
    a plurality of second-stage channelizers each configured to generate a plurality of final subbands from one of the plurality of intermediate subbands,
    wherein the intermediate subbands have wider bandwidth than the final subbands.

2. The subband channelizer of claim 1, wherein the first-stage channelizer comprises:
    a first-stage polyphaser channelizer to channelize the wideband input into the plurality of intermediate subbands using a Fourier transform.

3. The subband channelizer of claim 2, wherein the first-stage channelizer further comprises:
    a first-stage digital down-converter (DDC) to shift the frequency of the wideband input,
    wherein the first-stage polyphaser channelizer channelizes the frequency-shifted wideband input.

4. The subband channelizer of claim 1, wherein at least one of the plurality of second-stage channelizers comprises:
    a second-stage digital down-converter (DDC) to frequency shift the intermediate subband; and
    a second-stage polyphaser channelizer configured to generate the plurality of final subbands based on the frequency-shifted intermediate subband.

5. The subband channelizer of claim 4, wherein the second-stage DDC is configured to shift the frequency of the intermediate subband to align a center frequency of one of the final subbands with a center frequency of the second-stage polyphaser channelizer.

6. The subband channelizer of claim 1, wherein a subband frequency spacing within one or more of the frequency groups is the same.

7. The subband channelizer of claim 1, wherein frequency gaps between the frequency groups are not integer multiples of frequency spacing within the frequency groups.

8. The subband channelizer of claim 1, wherein different second-stage channelizers of the plurality of second-stage channelizers have different subband frequency spacing.

9. The subband channelizer of claim 1, wherein different second-stage channelizers of the plurality of second-stage channelizers have different decimation rates.

10. The subband channelizer of claim 4, wherein the second-stage polyphaser channelizers use a Fast Fourier transform (FFT) or a Discrete Fourier Transform (DFT) to generate the final subbands.

11. The subband channelizer of claim 10, wherein different second-stage channelizers of the plurality of second-stage channelizers have different Fourier Transform sizes.

12. The subband channelizer of claim 1, wherein the first-stage channelizer comprises:
a single polyphaser channelizer to channelize the wideband input into the plurality of intermediate subbands.

13. A subband channelizer for randomly spaced frequency groups, the subband channelizer comprising:
a first-stage channelizer configured to channelize a wideband input into a plurality of intermediate subbands, at least two of the plurality of intermediate subbands being partially overlapped; and
a plurality of second-stage channelizers each configured to generate a plurality of final subbands from one of the plurality of intermediate subbands and comprising:
a second-stage digital down-converter (DDC) to frequency shift the intermediate subband, and
a second-stage polyphaser channelizer configured to generate the plurality of final subbands based on the frequency-shifted intermediate subband.

14. The subband channelizer of claim 13, wherein the first-stage channelizer further comprises:
a first-stage digital down-converter (DDC) to shift the frequency of the wideband input,
wherein the first-stage channelizer channelizes the frequency-shifted wideband input.

15. The subband channelizer of claim 13, wherein at least one of the second-stage DDCs is configured to shift the frequency of the intermediate subband to align a center frequency of one of the final subbands with a center frequency of the second-stage polyphaser channelizer.

16. The subband channelizer of claim 13, wherein a subband frequency spacing within one or more of the frequency groups is the same.

17. The subband channelizer of claim 13, wherein frequency gaps between the frequency groups are not integer multiples of frequency spacing within the frequency groups.

18. The subband channelizer of claim 13, wherein different second-stage channelizers of the plurality of second-stage channelizers have different subband frequency spacing.

19. The subband channelizer of claim 13, wherein different second-stage channelizers of the plurality of second-stage channelizers have different decimation rates.

20. A subband channelizer comprising:
a first means for channelizing a plurality of frequency groups from a wideband signal, wherein frequency spacing between the frequency groups is random; and
a plurality of second means each for channelizing a plurality of frequency subbands from a corresponding one of the plurality of frequency groups, wherein all frequency subbands within the corresponding one of the plurality of frequency groups have the same bandwidth and frequency spacing.

* * * * *